United States Patent
Kim et al.

(10) Patent No.: US 8,482,977 B2
(45) Date of Patent: Jul. 9, 2013

(54) MULTI-BIT CELL MEMORY DEVICES USING ERROR CORRECTION CODING AND METHODS OF OPERATING THE SAME

(75) Inventors: Yong June Kim, Seoul (KR); Jaehong Kim, Seoul (KR); Junjin Kong, Yongin-si (KR); Hong Rak Son, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 206 days.

(21) Appl. No.: 13/039,004

(22) Filed: Mar. 2, 2011

(65) Prior Publication Data

US 2011/0216588 A1 Sep. 8, 2011

(30) Foreign Application Priority Data

Mar. 2, 2010 (KR) .......... 10-2010-0018657

(51) Int. Cl.
*G11C 16/04* (2006.01)

(52) U.S. Cl.
USPC .......... 365/185.03; 365/189.011; 365/185.09; 365/189.14; 365/189.15; 365/189.16

(58) Field of Classification Search
USPC .......... 365/189.011, 185.03, 185.09, 189.14, 365/189.15, 189.16
See application file for complete search history.

(56) References Cited

U.S. PATENT DOCUMENTS

| 2008/0094899 A1 | 4/2008 | Honma et al. |
| 2008/0235557 A1 | 9/2008 | Kim |
| 2011/0258514 A1* | 10/2011 | Lasser .................. 714/763 |

FOREIGN PATENT DOCUMENTS

| JP | 2008-077810 | 4/2008 |
| JP | 2008-108297 | 5/2008 |
| JP | 2008-234816 | 10/2008 |
| KR | 1020080086152 A | 9/2008 |

* cited by examiner

*Primary Examiner* — Thong Q Le
(74) *Attorney, Agent, or Firm* — Myers Bigel Sibley & Sajovec, P.A.

(57) ABSTRACT

A memory device includes a plurality of multi-bit memory cells. A plurality of input data bits are encoded according to an error correction code to generate a codeword including a plurality of groups of bits. Respective ones of the plurality of multi-bit memory cells are programmed to represent respective ones of the groups of bits of the codeword. The groups of bits of the codeword may be groups of consecutive bits. In some embodiments, the multi-bit memory cells are each configured to store in bits and a length of the codeword is an integer multiple of m. Data may be read from the multi-bit memory cells in page units or cell units to recover the codeword, and the recovered code word may be decode according to the error correction code to recover the input data bits.

20 Claims, 17 Drawing Sheets

US 8,482,977 B2

MULTI-BIT CELL MEMORY DEVICES USING ERROR CORRECTION CODING AND METHODS OF OPERATING THE SAME

CROSS-REFERENCE TO RELATED APPLICATIONS

This U.S. non-provisional patent application claims priority under 35 U.S.C. §119 of Korean Patent Application No. 10-2010-0018657, filed on Mar. 2, 2010, the entire contents of which are hereby incorporated by reference.

BACKGROUND OF THE INVENTION

The present inventive subject matter relates to semiconductor memory devices, and more particularly, to a state based nonvolatile memory device and an error correction method thereof.

Semiconductor memory devices may be classified into volatile memory devices and nonvolatile memory devices. Volatile memory devices typically have a high read speed and a high write speed but may lose stored data when not powered. Nonvolatile memory devices maintain stored data even when not powered. Thus, the nonvolatile memory devices are often used to store data that should be preserved regardless of status of the power supply. Nonvolatile memory devices may include mask read only memory (ROM), programmable ROM (PROM), erasable programmable ROM, electrically erasable programmable ROM (EPROM) and other devices.

There is an ongoing demand for nonvolatile memory devices that can provide random access, low power consumption, high speed and high capacity. For example, current development efforts include efforts to provide nonvolatile memory devices capable of random access as an eXecute in place (XIP) memory. This may involve development of overwritable nonvolatile memory.

An overwritable nonvolatile memory may be referred to as a state-based nonvolatile memory. Unlike a flash memory device programming multi-bit data by page units, a state-based nonvolatile memory may program data of two or more bits at a time. Examples of state-based nonvolatile memory devices include ferroelectric RAM (FRAM) using ferroelectric capacitors, magnetic RAM (MRAM) using tunneling magneto-resistive (TMR) layers, phase change RAM (PRAM) using chalcogenide alloys and resistive RAM (RRAM) using a variable resistance material layer as a data storage medium.

SUMMARY OF THE INVENTION

Embodiments of the inventive subject matter provide methods of operating a memory device including a plurality of multi-bit memory cells. A plurality of input data bits are encoded according to an error correction code to generate a codeword including a plurality of groups of bits. Respective ones of the plurality of multi-bit memory cells are programmed to represent respective ones of the groups of bits of the codeword. The groups of bits of the codeword may be groups of consecutive bits. In some embodiments, the multi-bit memory cells are each configured to store m bits and a length of the codeword is an integer multiple of m. In further embodiments, programming respective ones of the plurality of multi-bit memory cells to represent respective ones of the groups of bits of the codeword includes state-based programming.

According to additional embodiments, the methods further include reading data from the plurality of multi-bit memory cells to recover the codeword and decoding the recovered codeword according to the error correction code to recover the input data bits. In some embodiments, data is read from the plurality of multi-bit memory cells in page units to recover the codeword. In particular, bits may be sequentially retrieved from each of the plurality of memory cells in order of bit significance and the retrieved bits reordered to recover the codeword.

In further embodiments, data is read from the plurality of multi-bit memory cells in cell units to recover the codeword. Respective ones of the groups of bits of the codeword may correspond to respective symbols and the error correction code may include a non-binary error correction code (ECC). The multi-bit memory cells of the plurality of multi-bit memory cells may be configured to be overwritten.

Some embodiments provide a memory device including a plurality of multi-bit memory cells. The device further includes an error correction circuit configured to encode a plurality of input data bits according to an error correction code to generate a codeword including a plurality of groups of bits and a read/write circuit configured to program respective ones of the plurality of multi-bit memory cells to represent respective ones of the groups of bits of the codeword. The groups of bits of the codeword may be groups of consecutive bits. The multi-bit memory cells may be each configured to store m bits and wherein a length of the codeword is an integer multiple of in. The read/write circuit may be configured to support state-based programming of the plurality of memory cells.

In some embodiments, the read/write circuit may be configured to read data from the plurality of multi-bit memory cells to recover the codeword and the error correction circuit may be configured to decode the recovered codeword according to the error correction code to recover the input data bits. In some embodiments, the read/write circuit may be configured to read data from the plurality of multi-bit memory cells in page units. For example, the read/write circuit may be configured to sequentially retrieve bits from each of the plurality of memory cells in order of bit significance and to reorder the retrieved bits to recover the codeword.

In further embodiments, the read/write circuit may be configured to read data from the plurality of multi-bit memory cells in cell units to recover the codeword. Respective ones of the groups of bits of the codeword may correspond to respective symbols and the error correction code may be a non-binary error correction code (ECC). The multi-bit memory cells of the plurality of multi-bit memory cells may be configured to be overwritten.

BRIEF DESCRIPTION OF THE DRAWINGS

The accompanying drawings are included to provide a further understanding of the inventive subject matter, and are incorporated in and generate a part of this specification. The drawings illustrate exemplary embodiments of the inventive subject matter and, together with the description, serve to explain principles of the inventive subject matter. In the figures.

DETAILED DESCRIPTION

Preferred embodiments of the inventive subject matter will be described below in more detail with reference to the accompanying drawings. The embodiments of the inventive subject matter may, however, be embodied in different forms and should not be constructed as limited to the embodiments set forth herein. Rather, these embodiments are provided so that this disclosure will be thorough and complete, and will fully convey the scope of the inventive subject matter to those skilled in the art. Like numbers refer to like elements throughout.

Figure 1:
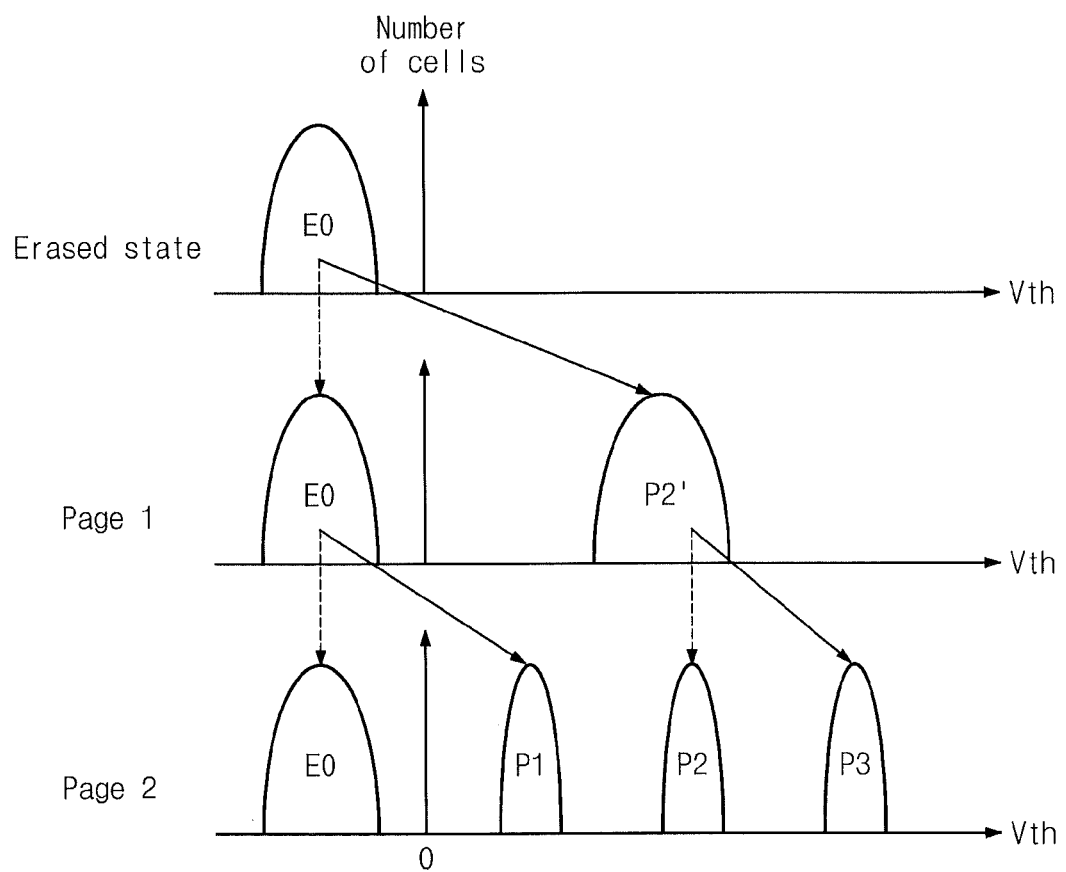
FIG. 1 is a drawing illustrating write operations of a page-based nonvolatile memory device.

FIG. 1 is a drawing illustrating write operations of a page-based nonvolatile memory device. FIG. 1 illustrates a distribution variation of threshold voltage of a flash memory device including 2-bit multi-level cell (MLC) is illustrated. If a first page Page 1 is programmed, selected memory cells are programmed to a threshold voltage corresponding to an erased state E0 or a programmed state P2'. The first page Page 1 of the 2-bit multi-bit cell (MLC) is called the least significant bit (LSB) page.

In programming a second page Page 2, threshold voltages of the memory cells having the erased state E0 maintain the erased state E0 or move to a programmed state P1. Memory cells having a threshold voltage corresponding to the programmed state P2' may be programmed to a programmed state P2 or to a programmed state P3.

As described above, a data program of a multi-level cell (MLC) flash memory device is performed in page units, for example, 2-bit data is written into a 2-bit MLC through two program operations and, in the case of a 3-bit MLC, data will be written by a page unit through three program operations. For this reason, a flash memory device may be called a page-based nonvolatile memory device. Programming by page units may reduce a coupling effect between adjacent cells and is referred to as "shadow programming." Time required in a program and complexity of a control operation differs from page of multi-level cell to page of multi-level cell. As the number of pages of data being programmed increases, complexity and time required to program increase.

Figure 2:
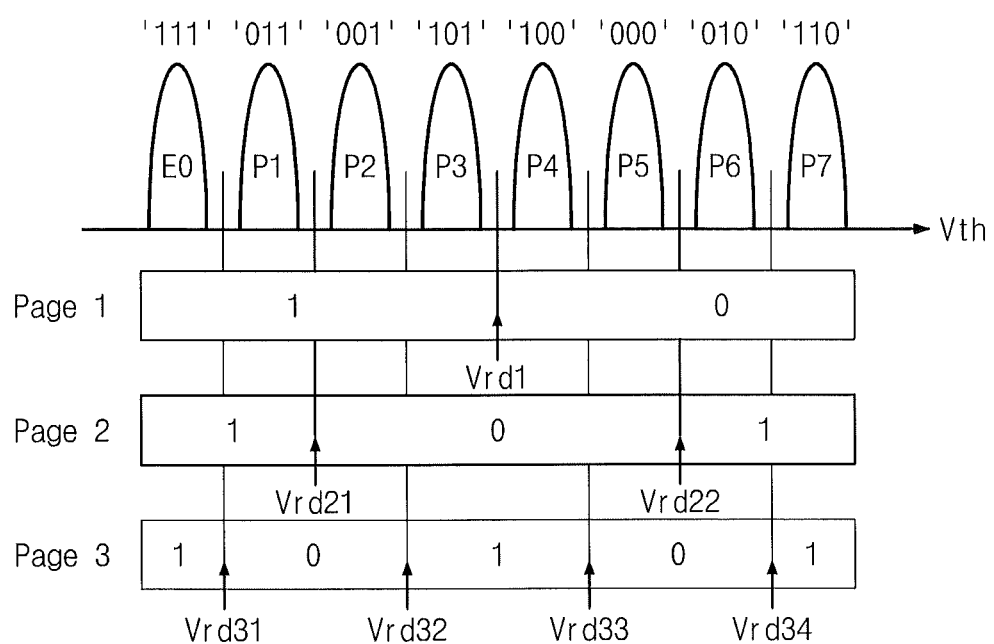
FIG. 2 is a drawing illustrating read operations of a page-based nonvolatile memory device.

FIG. 2 is a drawing illustrating read operations of a page-based nonvolatile memory device. Referring to FIG. 2, three pages Page 1, Page 2 and Page 3 are sequentially read in order to read data stored in a 3-bit multi-level cell (MLC). For example, a read voltage Vrd1 is applied to a word line of the selected memory cells in order to read the first page Page 1. A cell judged to be 'on-cell' by the read voltage Vrd1 is read to be logic "1". A cell judged to be 'off-cell' by the read voltage Vrd1 is read to be logic "0".

Read voltages Vrd21 and Vrd22 are applied to a word line of the selected memory cells in order to read the second page Page 2. Among the memory cells read to be logic "1" when a read operation of the first page Page 1 is performed, a cell judged to be 'on-cell' by the read voltage Vrd21 is read to be logic "1". Among the memory cells read to be logic "1" when a read operation of the first page Page 1 is performed, a cell judged to be 'off-cell' by the read voltage Vrd21 is read to be logic "0".

Among the memory cells read to be logic "0" when a read operation of the first page Page 1 is performed, a cell judged to be 'on-cell' by the read voltage Vrd22 is read to be logic "0". Among the memory cells read to be logic "0" when a read operation of the first page Page 1 is performed, a cell judged to be 'off-cell' by the read voltage Vrd21 is read to be logic "1".

In the same manner, in order to read data corresponding to the third page Page 3, the selected memory cells should be sensed by the read voltages Vrd21 and Vrd22 and read voltages Vrd31, Vrd32, Vrd33 and Vrd34. However, in order to read 3-bit data from one multi-level cell (MLC), different sensing conditions are provided to the pages Page 1, Page 2 and Page 3, respectively. For example, the read voltage Vrd1 need to be applied to the selected memory cells only once in order to read the first page Page 1. However, in order to read the second page Page 2, a read operation is required two times. In order to read the third page Page 3, a read operation is required four times.

This means that each of the pages is read at a different bit error rate (BER). In a page-based nonvolatile memory device programmed or read by a page unit, an error correction algorithm or an error correction device may be designed by taking into considering a page having the highest bit error rate (BER). A page-based nonvolatile memory device does not have an even bit error rate from the viewpoint of probability. Thus, it is not easy to apply an effective error correction technology to a page-based nonvolatile memory device.

Figure 3:
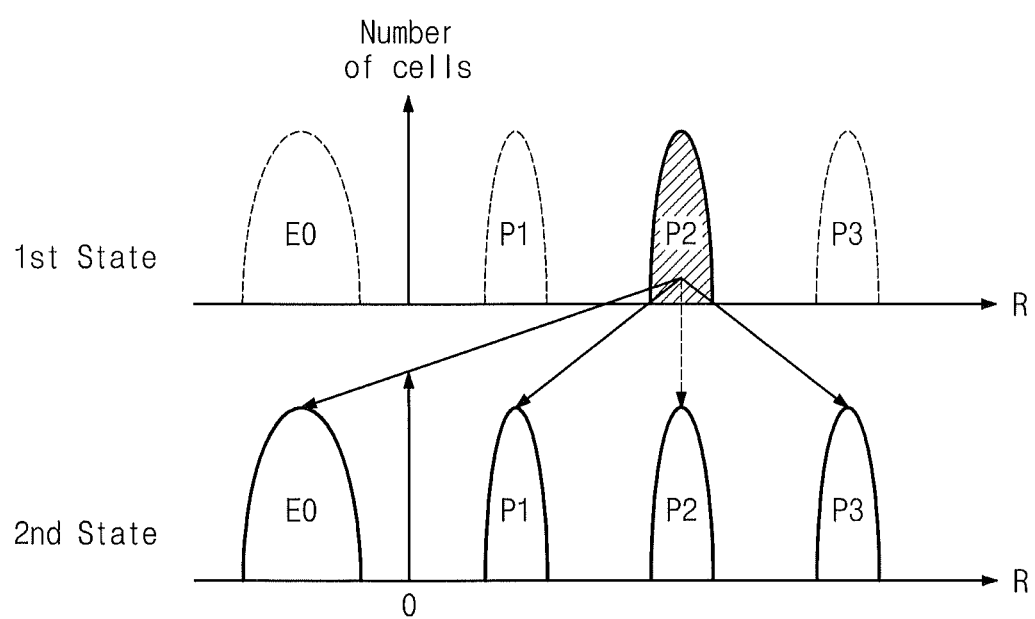
FIG. 3 is a drawing illustrating write operations of a state-based nonvolatile memory device.

FIG. 3 is a drawing illustrating write operations of a state-based nonvolatile memory device. Referring to FIG. 3, a state-based nonvolatile memory device (for example, a PRAM) does not need to program data of two or more bits into the selected memory cell by dividing the data into a page unit. In a state-based nonvolatile memory device, multi-bit data of two or more bits can be programmed into the selected memory cell at one time.

Unlike a flash memory device programmed after performing an erase, a PRAM can perform an overwriting operation regardless of the present programmed state of a memory cell. Also, since a coupling effect between adjacent cells does not exist in a PRAM, it is not necessary to program stage by stage by a page like a shadow program. Assume a case of programming 2-bit data into a memory cell having a resistance corresponding to the present programmed state P2. A memory cell can be freely programmed to any one of the programmed states E0, P1, P2 and P3 through a one time overwriting.

A state-based nonvolatile memory device can write data of two or more bits by a one time program operation. That is, since a movement of memory cell state is comparatively free through a one time program, the number of writing of multi-bit data of a state-based nonvolatile memory device is less than a page-based nonvolatile memory device.

Figure 4:
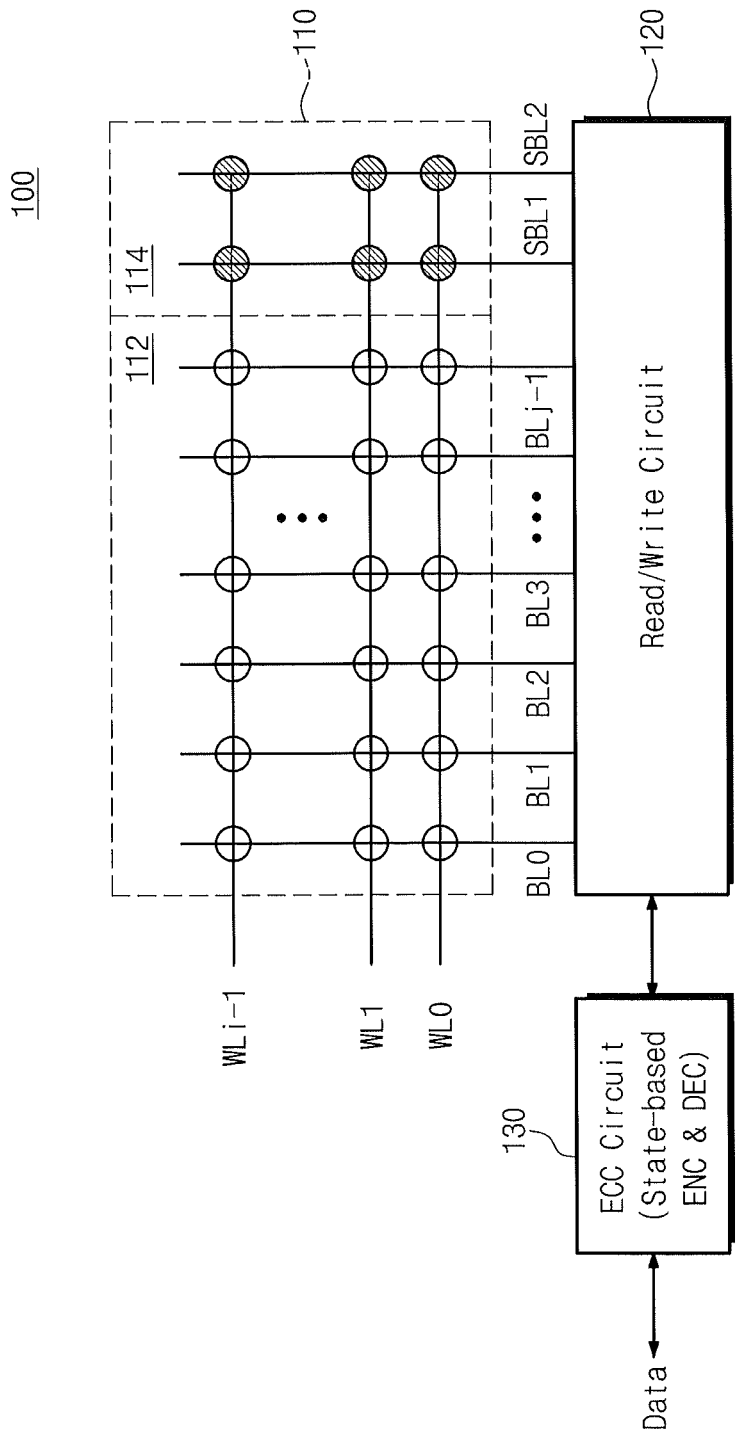
FIG. 4 is a block diagram illustrating a nonvolatile memory device in accordance with some embodiments of the inventive subject matter.

FIG. 4 is a block diagram illustrating a nonvolatile memory device in accordance with some embodiments of the inventive subject matter. Referring to FIG. 4, a state-based nonvolatile memory device 100 in accordance with some embodiments of the inventive subject matter includes a cell array 110, a read/write circuit 120 and an error correction code (ECC) circuit 130.

The cell array 110 includes a plurality of memory cells arranged by rows (or word lines) and columns (or bit lines). Each memory cell is formed of a nonvolatile memory device. According to some embodiments of the inventive subject matter, the cell array 110 may be divided into a main area 112 and a spare area 114. The main area 112 may store data bits. The spare area 114 may store parity bits and other meta data of data bits stored in the main area 112. Generation and storage of parity bit may be omitted according to an error correction method.

The data bits may be comprised of at least one codeword. A codeword is a data unit which generates a parity bit or becomes an error correction unit. According to some embodiments of the inventive subject matter, data bits included in one codeword are stored in distributed memory cells.

For example, data bits stored in a plurality of multi-level cells may form one codeword. For example, data stored in four 3-bit MLC provides 12 bits. Thus, 12 bits stored in four 3-bit MLC may become one codeword unit. In this case, multi-bit data read from each cell may have an equalized bit error rate (BER).

The read/write circuit 120 reads data stored in the cell array 110 or writes program data being received in the cell array 110. The read/write circuit 120 writes program data transferred from the error correction code (ECC) circuit 130 in the cell array 110 according to a state-based program method.

The error correction code (ECC) circuit 130 classifies the received program data by codeword units. The error correction code (ECC) circuit 130 rearranges the classified codeword unit data to an arrangement suitable for state-based programming. The rearranged program data is transferred to the read/write circuit 120 and is programmed into the cell array 110. The error correction code (ECC) circuit 130 regenerates read data received from the read/write circuit 120 by a codeword unit to detect an error or correct the detected error.

According to the aforementioned description, the nonvolatile memory device 100 rearranges so that the received data is stored in the cell array 110 by a state-based method. A parity bit may be generated from data bit of a codeword unit rearranged by the error correction code (ECC) circuit 130 or a codeword is generated so as to be appropriated for a state-based method by the error correction code (ECC) circuit 130. The generated codeword is stored in the cell array 110 and is rearranged in a codeword unit when reading the codeword.

Figure 5:
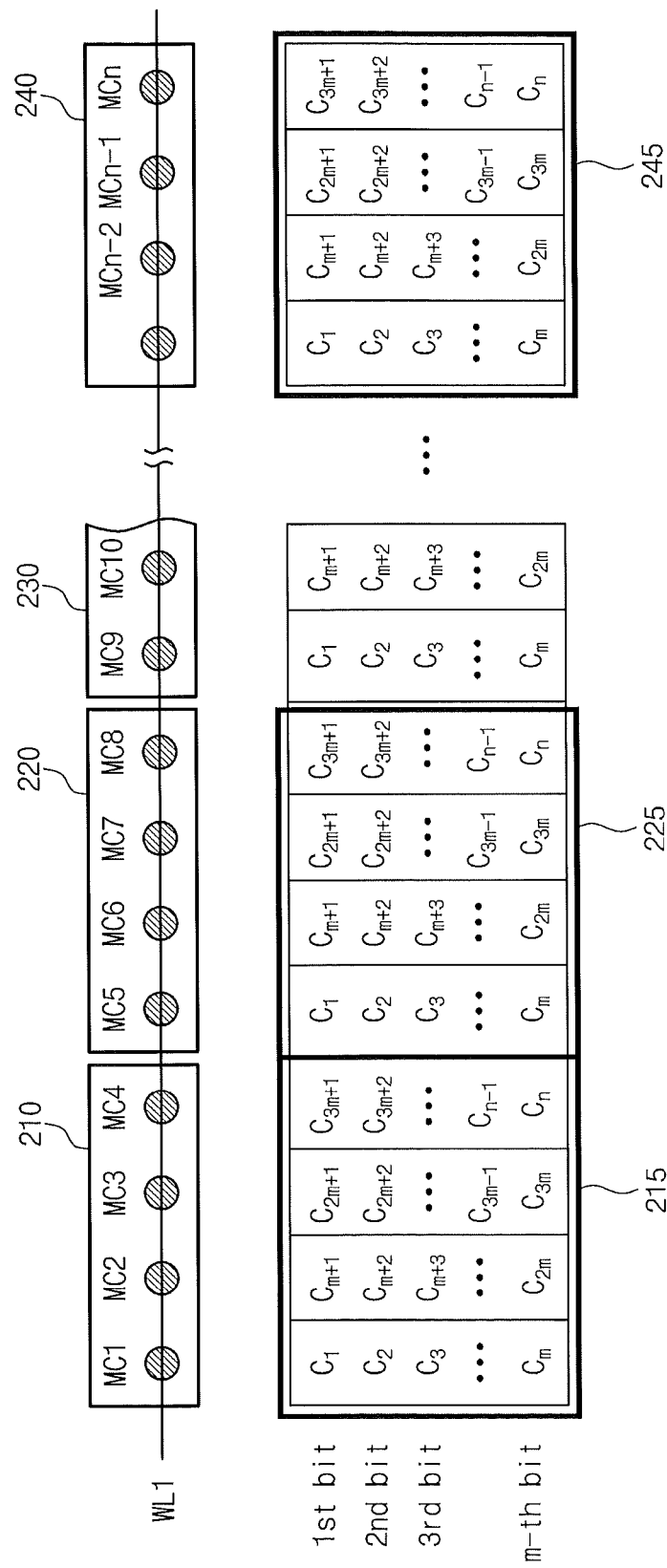
FIG. 5 is a drawing illustrating codeword generation operations method in accordance with some embodiments of the inventive subject matter.

FIG. 5 is a drawing illustrating codeword generation in accordance with some embodiments of the inventive subject matter. Referring to FIG. 5, a generation of data bit stored in the main area 112 of the cell array 110. Here, assume that m-bit data may be stored in one memory cell and one codeword is stored in four memory cells.

One codeword 215 is stored in four memory cells 210 (MC1, MC2, MC3, MC4). One codeword is stored in memory cells 220 (MC5, MC6, MC7, MC8), memory cells 230 (MC9, MC10, - - - ), memory cells 240 ( - - - , MCn-2, MCn-1, MCn), respectively.

The codeword 215 of n-length may be stored in the memory cells 210 (MC1, MC2, MC3, MC4). The codeword 215 includes n-bit binary data of $C_1, C_2, - - - , C_n$ The error correction code (ECC) circuit 130 divides n-bit data among data sequentially received from the outside into a codeword. The error correction code (ECC) circuit 130 rearranges the divided n-bit data to generate the codeword 215.

The codewords 215 are arranged so as to store sequentially received data in the memory cells 210 according to a state-based program method. That is, data column $(C_1, C_2, \ldots, C_m)$ may be stored in the memory cell MC1 as multi-bit data. Data column $(C_{m+1}, C_{m+2}, - - -, C_{2m})$ may be stored in the memory cell MC2 as multi-bit data. Data column $(C_{2m+1}, C_{2m+2}, - - -, C_{3m})$ may be stored in the memory cell MC3 as multi-bit data. Data column $(C_{3m+1}, C_{3m+2}, - - -, C_n)$ may be stored in the memory cell MC4 as a multi-bit data. Each of the memory cells MC1, MC2, MC3 and MC4 may store maximum m-bit data. M-bit data stored in each memory cell are combined with one another to generate one codeword.

The codeword generation method can be applied to memory cells of all the main areas 112 including the memory cells 210, 220, 230 and 240. Data bits constituting one codeword are generated by multi-bit data of each of the memory cells 210, 220, 230 and 240. Thus, codewords 215, 225, . . . , 245 may have an equalized bit error rate.

Figure 6:
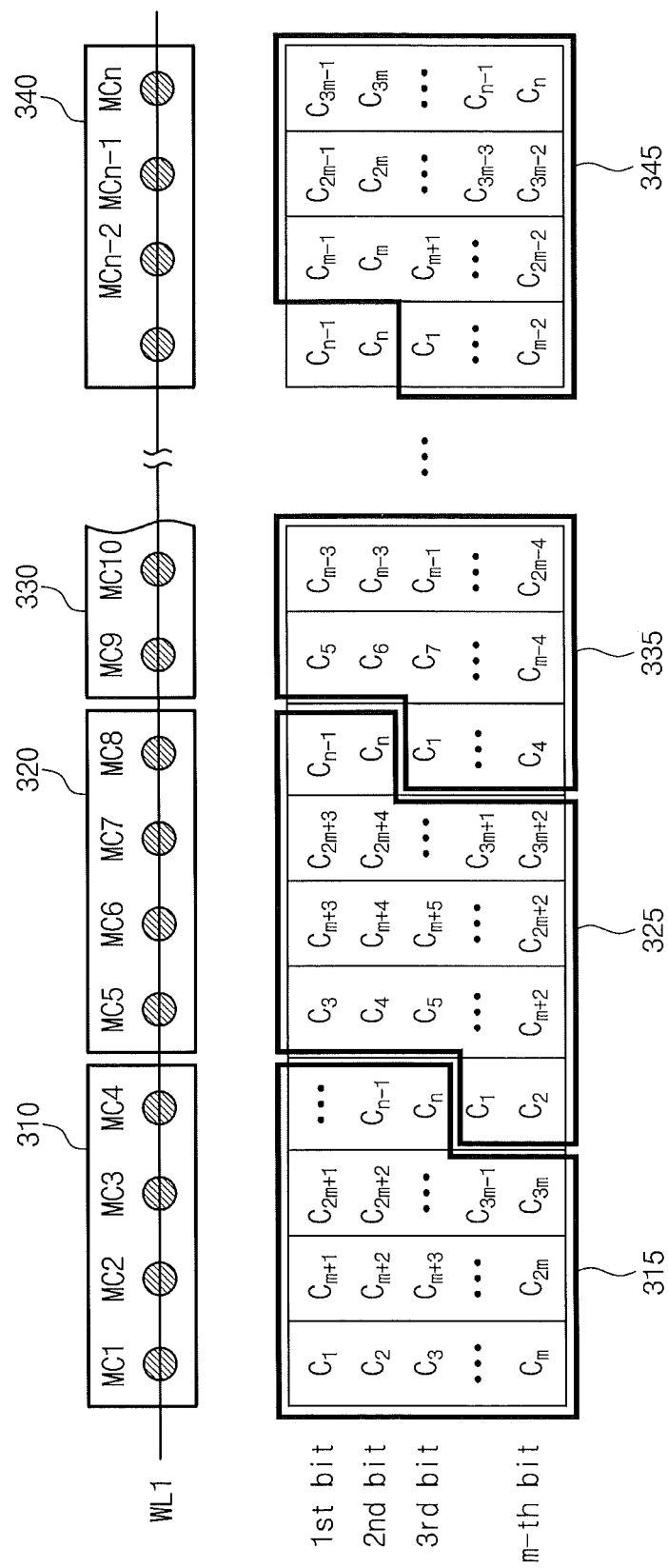
FIG. 6 is a drawing illustrating codeword generation operations in accordance with further embodiments of the inventive subject matter.

FIG. 6 is a drawing illustrating another example of codeword generation in accordance with some embodiments of the inventive subject matter. One codeword has code length shorter than the maximum bit number which can be stored in four memory cells. That is, FIG. 6 shows a more generalized state-based write operations than those described in FIG. 5.

A codeword 315 is stored in four memory cells 310 (MC1, MC2, MC3, MC4). However, a length n of a codeword $(C_1, C_2, \ldots, C_n)$ may be not an integer multiple of the maximum bit number n which can be stored in one memory cell. The memory cell MC4 among the four memory cells 310 can store the bits included in a codeword 315 and a codeword 325. That is, the memory cell MC4 can store bits $(C_{3m+1}, - - -, C_{n-1}, C_n)$ of the codeword 315 and a portion $(C_1, C_2)$ of bits of the codeword 325 as a multi-bit data.

A memory cell MC8 among memory cells 320 can store a portion ( - - - , $C_{n-1}$, $C_n$) of the codeword 325 and a portion ($C_1$, $C_2$, - - - , $C_4$) of a codeword 335. Memory cells storing bits of two codewords may exist in memory cells 330 and memory cells 340. This codeword generation has nothing to do with the number of memory cells in which one codeword can be stored. That is, even in the case that one codeword is stored in memory cells larger or smaller than four memory cells, the codeword constitute can be effectively applied.

Figure 7:
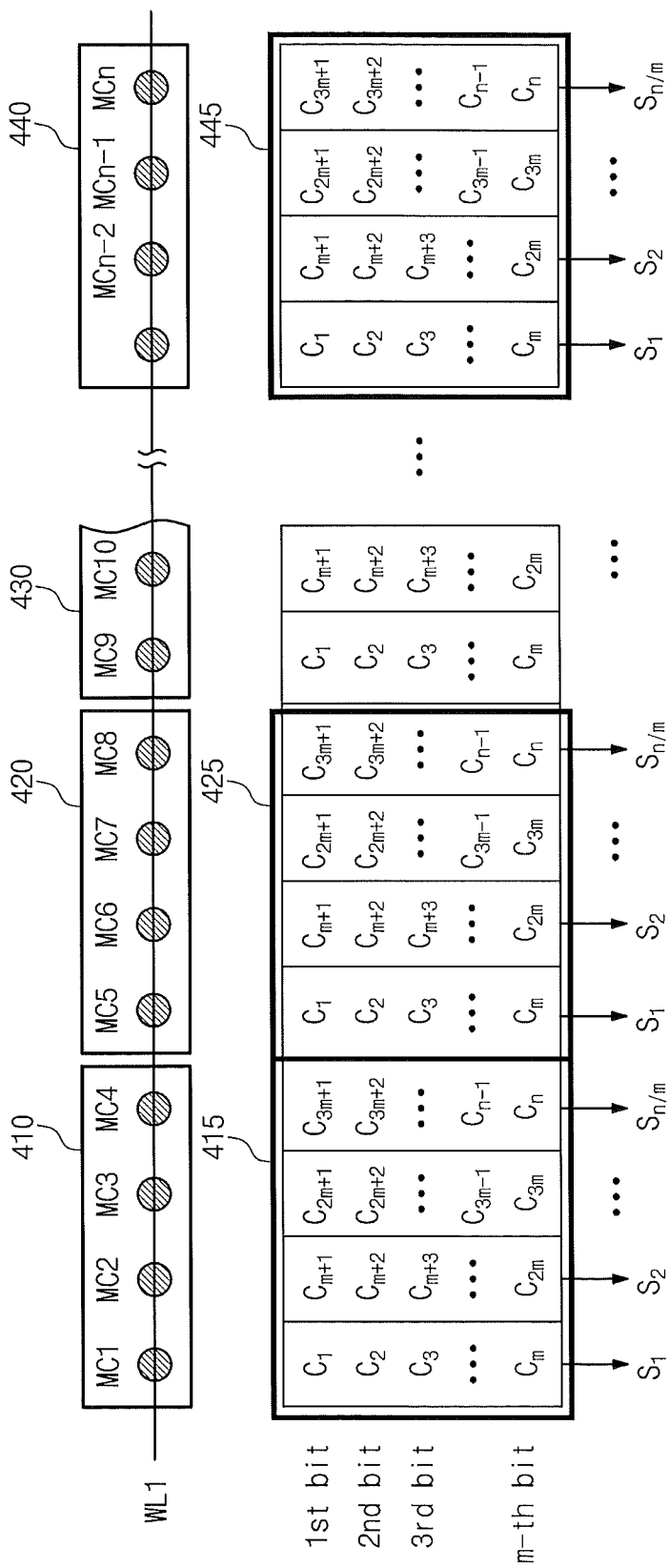
FIG. 7 is a drawing illustrating codeword generation operations in accordance with further embodiments of the inventive subject matter.

FIG. 7 is a drawing illustrating still another example of codeword generation in accordance with further embodiments of the inventive subject matter. Referring to FIG. 7, codeword generation operations for supporting an error correction operation is illustrated.

In order to perform an m-ary error correction operation, a codeword may be generated so that one symbol is stored in one memory cell. That is, one memory codeword 415 is stored in memory cells 410 (MC1, MC2, MC3, MC4). The codeword 415 is comprised of a plurality of symbols. That is, a relation between a codeword C and symbols is represented as shown in equation (1):

$$C = (s_1, s_2, \ldots , s_{n/m}) \quad (1)$$
$$= (c_1, c_2, \ldots , c_n),$$

where is represents a length of a binary codeword, m represents the maximum bit number which can be stored in one memory cell and n/m represents the number of symbols constituting one codeword.

One symbol $S_1$ can be stored in one memory cell MC1. A message stored in one symbol corresponds to a m-bit binary data. For example, a symbol $S_1$ may be generated by data column ($C_1$, $C_2$, $C_m$) stored in the memory cell MC1. A symbol $S_2$ may be generated by data column ($C_{m+1}$, $C_{m+2}$, $C_{2m}$) stored in the memory cell MC2. A symbol $S_{n/m}$ may be generated by data column ( . . . , $C_{n-1}$, $C_n$) stored in the memory cell MC4.

In the case (e.g., an analog sensing) that a multi-bit data stored in one memory cell can be discriminated by a symbol unit, a codeword can be generated by a symbol unit. In this case, an error correction operation (e.g., Reed-Solomon code) executed by a symbol unit can be applied.

Figure 8:
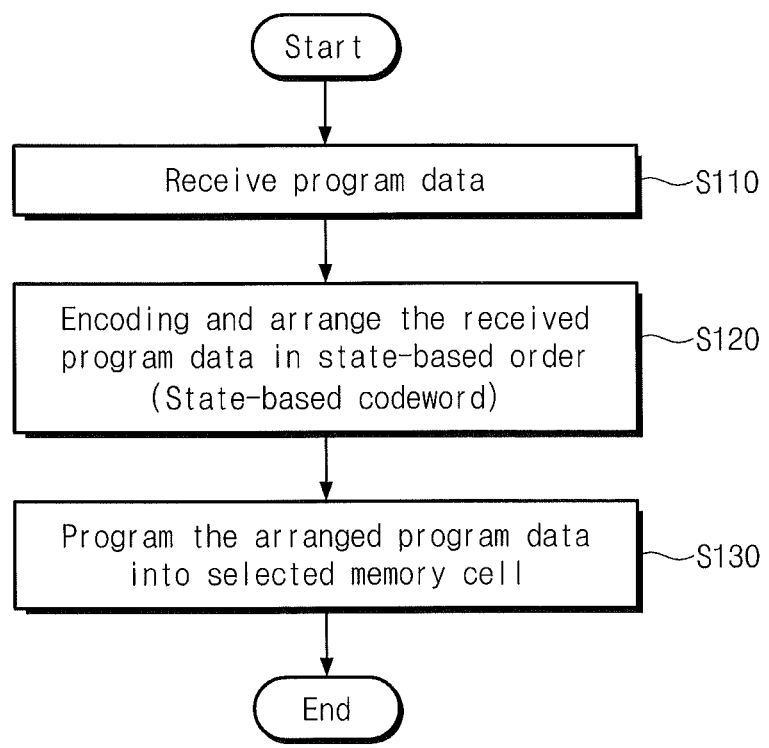
FIG. 8 is a flow chart illustrating program operations in accordance with some embodiments of the inventive subject matter.

FIG. 8 is a flow chart illustrating program operations in accordance with some embodiments of the inventive subject matter. Referring to FIG. 8, if a write command and program data are provided from an external device to the nonvolatile memory device 100 of FIG. 4, a state-based program process starts. In operations S110, program data is provided from the external device and temporarily stored in a buffer of the nonvolatile memory device 100. The error correction circuit 130 of FIG. 4 receives program data stored in the buffer.

In operations S120, the error correction circuit 130 encodes the received program data and arranges the received program data for use in a state-based programming process. For example, the error correction circuit 130 may divides the received program data by a codeword unit for error detection or error correction. The error correction circuit 130 assigns bits included in one codeword to the selected memory cells for state-based programming. For example, according to the operations described above with reference to FIGS. 5-7, data may be assigned so that consecutive bits of a codeword are stored in one memory cell.

In operations S130, data generated by the error correction circuit 130 is transferred to the read/write circuit 120. The read/write circuit 120 writes data to selected memory cells using a state-based program.

Figure 9:
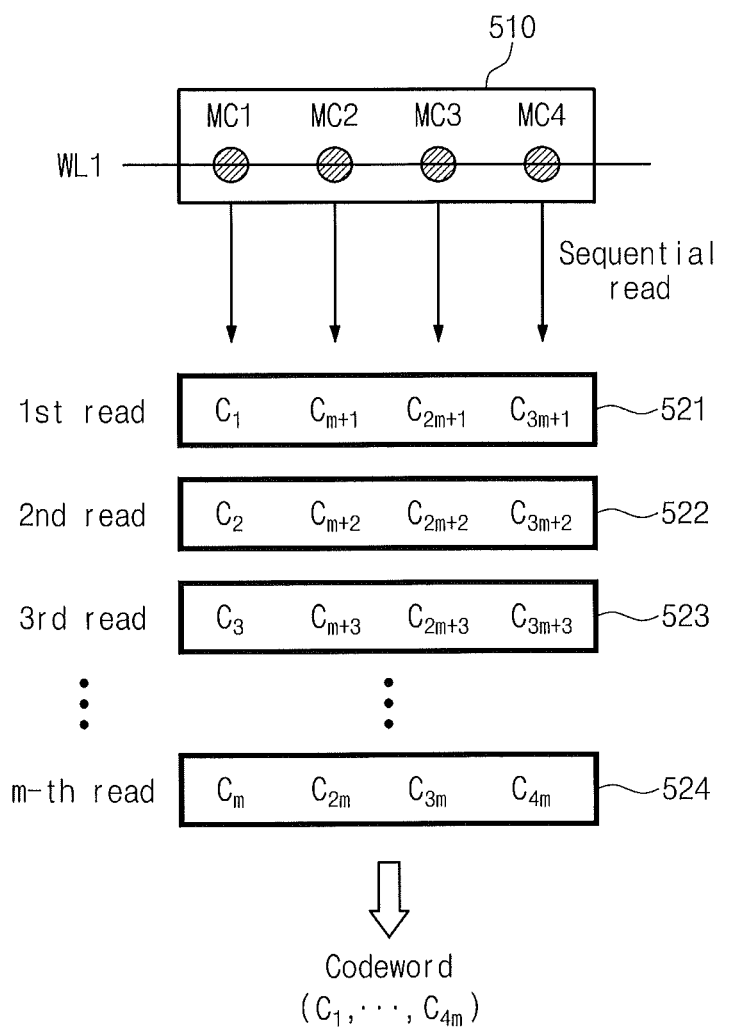
FIG. 9 is a drawing illustrating read operations in accordance with some embodiments of the inventive subject matter.

FIG. 9 is a drawing illustrating operations for reading data stored in a state-based nonvolatile memory device according to some embodiments of the inventive subject matter. Referring to FIG. 9, multi-bit data stored in memory cells is read through a plurality of read operations, somewhat like the way in which multi-bit data is read by page units in a multi-bit flash memory.

An m-bit data is stored in each of memory cells 510. The m-bit data can be sequentially read through a plurality of read operations. That is, the m-bit data stored in one memory cell can be output by performing a sensing operation at least m times. In this case, data 521 ($C_1$, $C_{m+1}$, $C_{2m+1}$, $C_{3m+1}$) is read through a first read operation (1st read). Data 522 ($C_2$, $C_{m+2}$, $C_{2m+2}$, $C_{3m+2}$) is read through a second read operation (2nd read). Data 523 ($C_3$, $C_{m+3}$, $C_{2m+3}$, $C_{3m+3}$) is read through a third read operation (3rd read). Data 524 ($C_m$, $C_{2m}$, $C_{3m}$, $C_{4m}$) is read through an m-th read operation (m-th read).

The data 521, 522, 523 and 524 read through a plurality of read operations are rearranged in a codeword ($C_1$, $C_2$, - - - , $C_{4m}$) by the error correction circuit 130. The error correction circuit 130 performs an error detection and an error correction operation on the rearranged codeword ($C_1$, $C_2$, - - - , $C_{4m}$).

Figure 10:
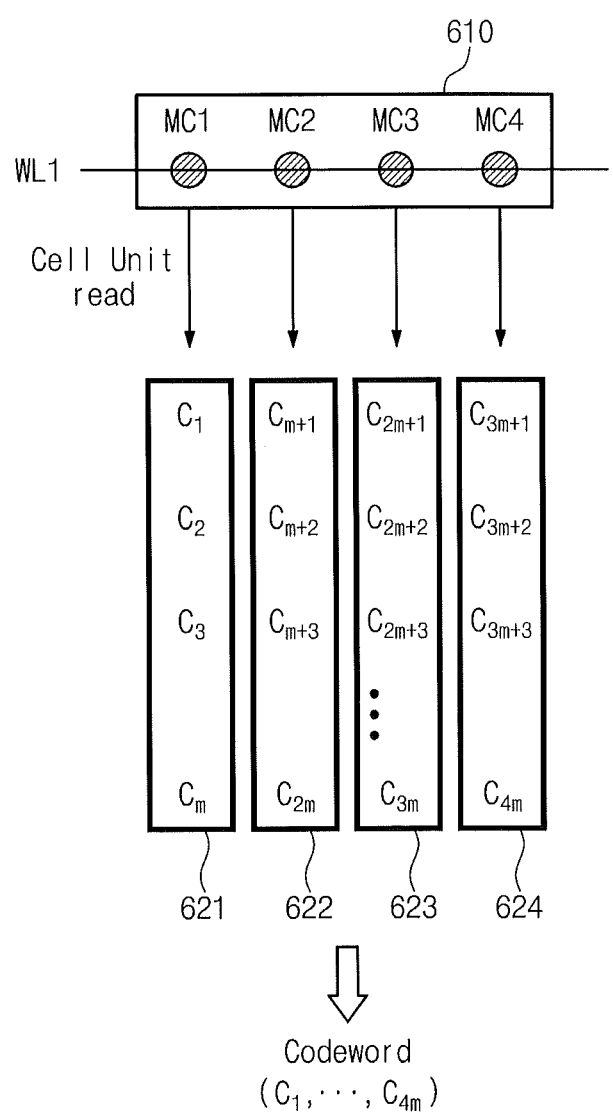
FIG. 10 is a drawing illustrating read operations in accordance with further embodiments the inventive subject matter.

FIG. 10 is a drawing illustrating read operations in accordance with further embodiments of the inventive subject matter. Referring to FIG. 10, a multi-bit data stored in each of memory cells 610 (MC1, MC2, MC3, MC4) are generated and processed at one time. That is, a multi-bit data stored in one memory cell can be read through a cell unit.

In a case of a memory like a variable resistance memory, a multi-bit data stored in one memory cell can be output at a time according to a sensing method. That is, if cell states of the selected memory cells are sensed, multi-bit data corresponding to the cell states can be determined at once. The read technique may be difficult to realize in the case of being selected by a page unit and can be realized through a read operation selected and sensed by a cell unit.

When performing a read operation by a cell unit, if a memory cell MC1 is selected, multi-bit data 621 ($C_1$, $C_2$, ..., $C_m$) stored in the memory cell MC1 can be read at one time. Subsequently, if a memory cell MC2 is selected, multi-bit data 622 ($C_{m+1}$, $C_{m+2}$, ..., $C_{2m}$) stored in the memory cell MC2 can be read at a time. If a memory cell MC3 is selected, multi-bit data 623 ($C_{2m+1}$, $C_{2m+2}$, ..., $C_{3m}$) stored in the memory cell MC3 can be read at a time. If a memory cell MC4 is selected, multi-bit data 624 ($C_{3m+1}$, $C_{3m+2}$, ..., $C_{4m}$) stored in the memory cell MC4 can be read at a time.

Data 621, 622, 623 and 624 sequentially output through a cell unit read operation generate a complete codeword ($C_1$, $C_2$, ... $C_{4m}$) by the error correction circuit 130. If a codeword generation is completed, the error correction circuit 130 detects an error and corrects the detected error.

Figure 11:
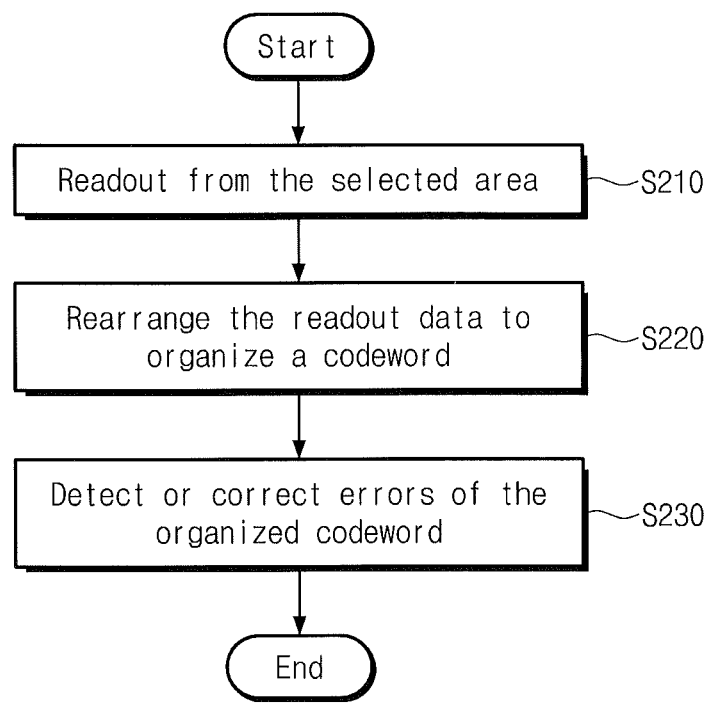
FIG. 11 is a flow chart illustrating read operations in accordance with some embodiments of the inventive subject matter.

FIG. 11 is a flow chart illustrating read operations in accordance with further embodiments of the inventive subject matter. Referring to FIG. 11, if a read command is provided from the outside, a read process with respect to the selected memory cells starts. In operations S210, the read/write circuit 120 readouts data from the selected memory cells using a page unit read technique or a cell unit read technique. Data readout by the page unit read technique provides the readout data to the error correction circuit 130 by the selected page unit. In the cell unit read technique, the readout data is transferred to the error correction circuit 130 by a multi-bit data unit stored in one memory cell.

In operations S220, the error correction circuit 130 regenerates the received readout data in a complete codeword. In a case of data readout by a page unit read method, the error correction circuit 130 considers bits located at the same column of each page as sequential bits to complete one codeword. In a case of data readout by a cell unit read method, the error correction circuit 130 sequentially buffers the received readout data to generate a complete codeword.

In operations S230, the error correction circuit 130 detects an error in a codeword. If the error correction circuit 130 detects an error in one codeword, it corrects the detected error. If detection and correction of an error is completed, the error correction circuit 130 transfers the error-corrected data to a data output means, such as an input/output buffer.

Figure 12:
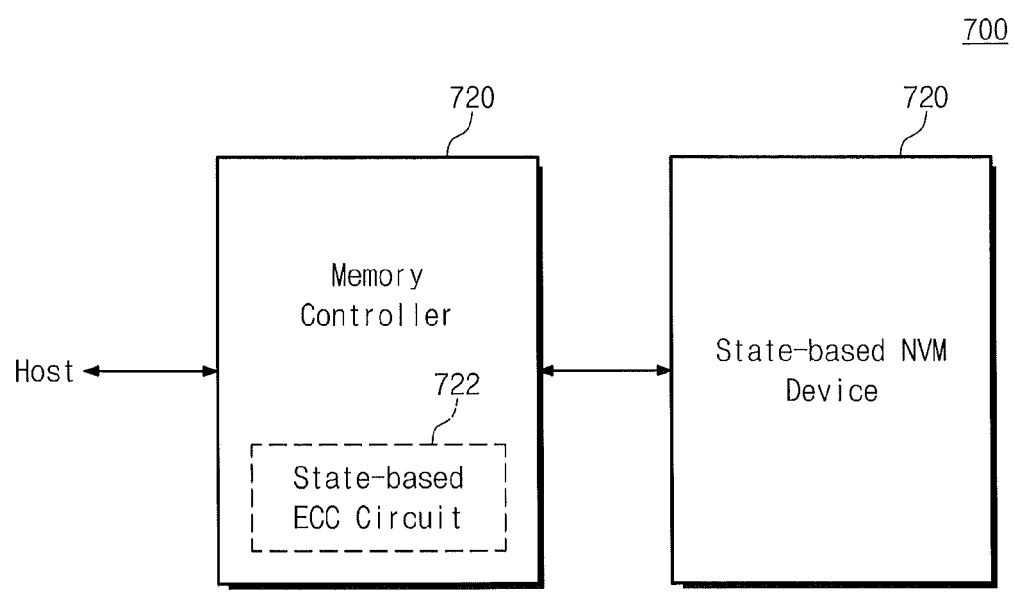
FIG. 12 is a block diagram illustrating a memory system performing state-based error correction operations according to some embodiments of the inventive subject matter.

FIG. 12 is a block diagram illustrating a memory system performing state-based error correction according to some embodiments of the inventive subject matter. Referring to FIG. 12, a memory system 700 includes a state-based nonvolatile memory device 710 and a memory controller 720 providing an interface between the state-based nonvolatile memory device 710 and a host. The memory controller 720 may include a state-based error correction code (ECC) circuit 722.

The host requests at the memory controller 720 that data is stored or the stored data is read when necessary. When a program command is provided from the host, the memory controller 720 transfers program data received from the host to the state-based error correction code circuit 722. The state-based error correction code circuit 722 generates a codeword using, for example, the operations described above with reference to FIGS. 5-7. The state-based error correction code circuit 722 transfers the generated codeword to the state-based nonvolatile memory device 710. The state-based nonvolatile memory device 710 programs the received data into the selected memory cells.

If a read command is transferred from the host to the memory controller 720, the memory controller 720 controls the state-based nonvolatile memory device 710 so as to read data from the selected memory cells. If data is read from the state-based nonvolatile memory device 710 using a page unit read technique, the state-based error correction code circuit 722 considers bits located at the same column of each page as sequential bit to complete one codeword.

If data is read from the state-based nonvolatile memory device 710 using a cell unit read technique, the state-based error correction code circuit 722 sequentially buffers the read data to generate one complete codeword. When a codeword is completed, the state-based error correction code circuit 722 detects and corrects an error. When error correction is completed, the memory controller 720 provides the error-corrected data to the host.

Figure 13:
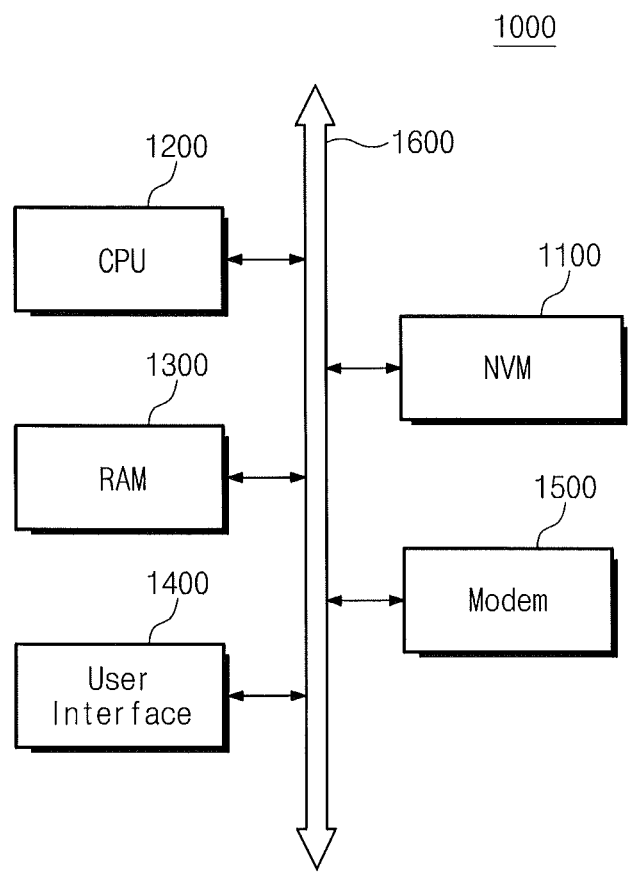
FIG. 13 is a block diagram illustrating a computer system including a state-based nonvolatile memory device according to some embodiments of the inventive subject matter.

FIG. 13 is a block diagram illustrating a computer system 1000 including a state-based nonvolatile memory device 1100 in accordance with some embodiments of the inventive subject matter. The computer system 1000 includes a nonvolatile memory device 1100, a microprocessor 1200, a RAM 1300, a user interface 1400 and a modem such as a baseband chipset that are electrically connected to a system bus 1600. Here, the nonvolatile memory device 1100 includes nonvolatile memory cells capable of overwriting.

In the case that the computer system 1000 is a mobile device, a battery for providing an operation voltage of the computer system 1000 may be additionally provided. The computer system 1000 may further include an application chipset, a camera image processor (CIS), a mobile DRAM or the like. The nonvolatile memory device 1100 may be a nonvolatile memory device capable of overwriting like the nonvolatile memory device 100 of FIG. 1.

Figure 14:
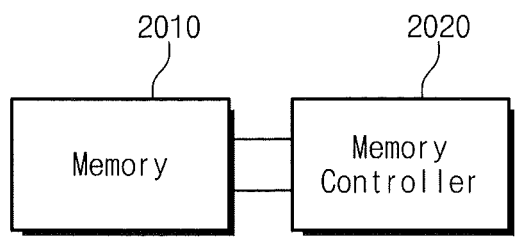
FIG. 14 is a block diagram illustrating an application of a state-based nonvolatile memory device according to some embodiments of the inventive subject matter.

FIG. 14 is a block diagram illustrating an example of an application of a state-based nonvolatile memory device according to some embodiments of the inventive subject matter. A memory device 2010 and a memory controller 2020 are electrically connected to a memory device 2010. The memory device 2010 may be a nonvolatile memory device capable of overwriting as described above. The memory controller 2020 provides a signal for controlling the memory device 2010. For example, the memory controller 2020 may provide a command and an address for accessing the memory device 2010.

The memory controller 2020 may include a memory interface, a host interface, an ECC circuit, a central processing unit and a buffer memory. The memory interface provides data received from the buffer memory to the memory device 2010 or transfers data read from the memory device 2010 to the buffer memory. Also, the memory interface may provide a command or an address received from an external host to the memory device.

The host interface can communicate with an external host using a universal serial bus (USB), a small computer system interface (SCSI), a PCI express, an ATA, a parallel ATA (RATA), a serial ATA (SATA), a serial attached SCSI (SAS) or the like.

The memory controller 2020 may include an ECC circuit. The ECC circuit may generate an error correction code from data transferring to the memory device 2010. The generated error correction code may be stored in a specific area of the memory device 2010 together with the data. The ECC circuit detects an error of data read from the memory device. If the detected error is within the range of correction, the ECC circuit corrects the detected error.

The central processing unit analyzes and processes signals received from an external host. The central processing unit controls the memory device 2010 through the host interface or the memory interface. The central processing unit can control read, writing and erasure operations of the memory device 2010 according to firmware for driving a memory. The buffer memory temporally stores writing data provided from an external host or data read from the memory device 2010.

Figure 15:
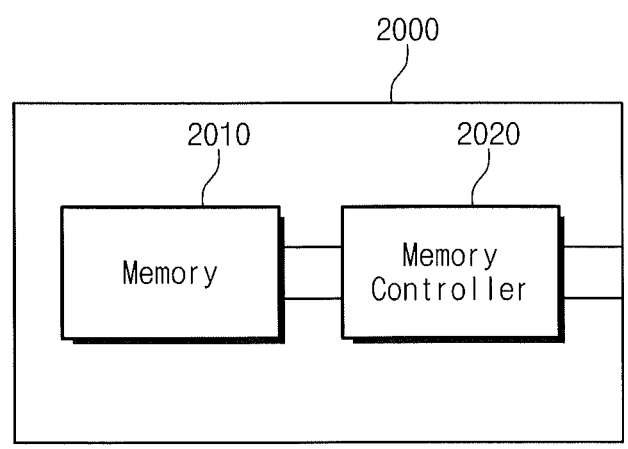
FIG. 15 is a block diagram illustrating a memory card including a state-based nonvolatile memory device according to some embodiments of the inventive subject matter.

FIG. 15 is a block diagram illustrating another example of an application of a state-based nonvolatile memory device according to some embodiments of the inventive subject matter. The application shown in FIG. 15 is substantially the same as that shown in FIG. 14 except that the memory device 2010 and the memory controller 2020 are mounted on a memory card 2000. The memory card 2000 may be built in an information processing device such as a digital camera, a PMP, a mobile phone and a notebook computer. The memory card 2000 may be generated by a multimedia card (MMC), a secure digital (SD) card, a micro SD card, a memory stick, an ID card, a PCMCIA card, a chip card, a USB card, a smart card, a compact flash (CF) card or the like.

Figure 16:
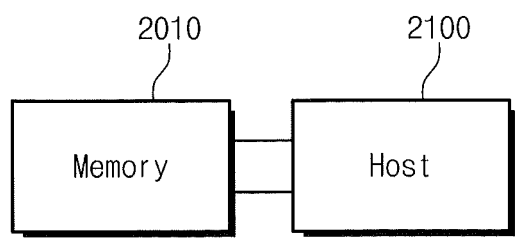
FIG. 16 is a block diagram illustrating an application utilizing a state-based nonvolatile memory device according to some embodiments of the inventive subject matter.

FIG. 16 is a block diagram illustrating another example of an application of a nonvolatile memory device according to some embodiments of the inventive subject matter. A memory device 2010 is connected to a host 2100. The host 2100 may be an information processing device such as a digital camera, a PMP, a mobile phone and a notebook computer. The host 2100 can provide a control signal for controlling the memory device 2010. For example, the host 2100 can provide a command or an address for accessing the memory device 2010. The memory device 2010 may be a nonvolatile memory device capable of an overwriting which is substantially the same with the nonvolatile memory device 100 illustrated in FIG. 1.

Figure 17:
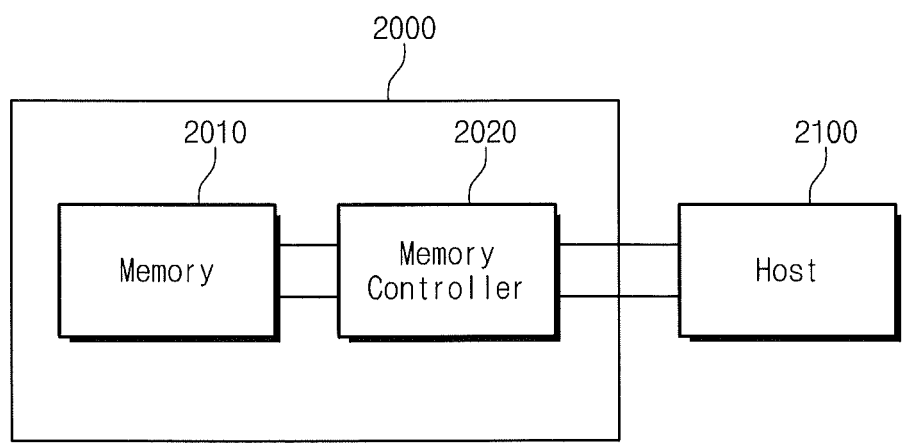
FIG. 17 is a block diagram illustrating a computer system including the memory card of FIG. 15.

FIG. 17 illustrates some embodiments in which the host 2100 is electrically connected to the memory card of FIG. 15. In these embodiments, the host 2100 may provide a command, an address and data to the memory controller 2020. The memory controller 2020 responsively provides a control signal for accessing the memory device 2010.

Figure 18:
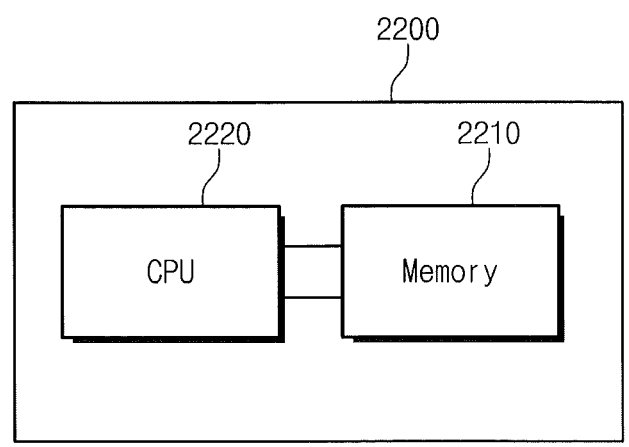
FIG. 18 is a block diagram illustrating a computer system in accordance with further embodiments of the such that a state-based nonvolatile memory device of the inventive subject matter is directly connected to a central processing unit.

FIG. 18 is a block diagram illustrating an example of an application in which a memory device 2210 is connected to a central processing unit 2220. The memory device 2210 is included in a computer system 2200 and can be electrically connected to the central processing unit 2220 by a connection means, such as a data bus. The computer system 2200 may be an information processing device such as a digital camera, a PMP, a mobile phone, a desktop computer, a notebook computer or the like.

Figure 19:
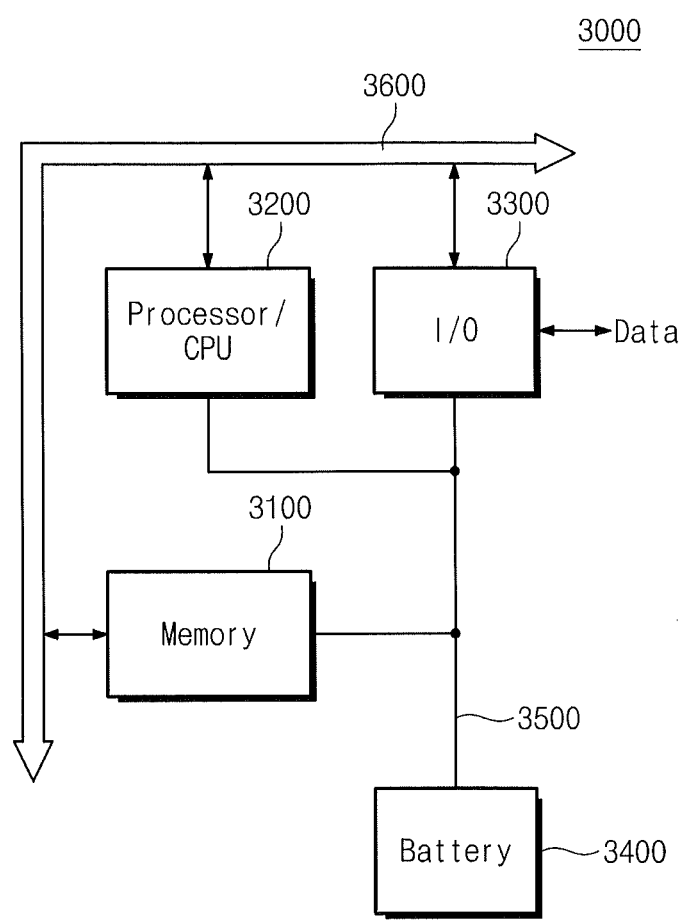
FIG. 19 is a block diagram of a portable system using a state-based nonvolatile memory device of the inventive subject matter.

FIG. 19 is a block diagram of a portable system application for a nonvolatile memory device in accordance with additional embodiments of the inventive subject matter. In a portable system 3000, a memory device 3100 connected to a microprocessor 3200 through a bus line 3600 may be driven as a main memory of the portable system 3000. A battery 3400 provides a power supply to the microprocessor 3200, an input/output device 3300 and the memory device 3100 through a power line 3500.

If data is provide from the outside to the input/output device 3300, the microprocessor 3200 receives and processes the data through the bus line 3600, and then provides the received or processed data to the memory device 3100 through the bus line 3600. The memory device 3100 stores data provided through the bus line 3600 in a memory cell. Also, the data stored in the memory cell is read by the microprocessor 3200 and output to the outside through the input/output device 3300.

Even when a power supply of the battery 3400 is not provided to the power line 3500, data stored in the memory cell is not lost. This is because the memory device 3100 is nonvolatile, unlike a DRAM. The memory device 3100 may also provide advantages such as high operational speed and low power consumption.

Figure 20:
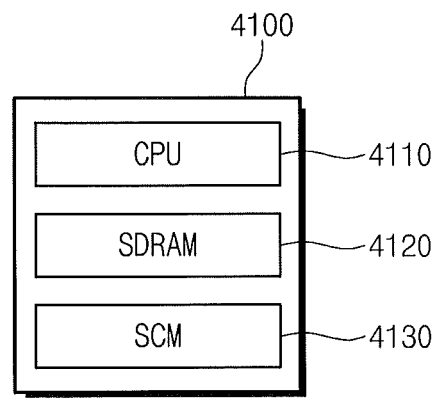
FIG. 20 is a block diagram illustrating an example of a memory system including a state-based nonvolatile memory device of the inventive subject matter.

FIG. 20 shows a memory system structure in which a state-based nonvolatile memory (or storage class memory: SCM) according to some embodiments of the inventive subject matter is used instead of conventional flash memory. Referring to FIG. 20, a memory system 4100 includes a CPU 4110, a SDRAM 4120 and a SCM 4130. Here, the SCM 4130 is used as a data storage memory instead of a conventional flash memory.

In the memory system 4100 illustrated in FIG. 20, the SCM 4130 has a high data access speed compared with conventional flash memory. For example, under the PC circumstance that the CPU 4110 operates at 4 GHz, a phase change memory device PRAM which is a kind of SCM 4130 has an access speed of 32 times as fast as a flash memory. Thus, the memory system 4100 including the SCM 4130 may provide faster access than a memory system including a conventional flash memory.

Figure 21:
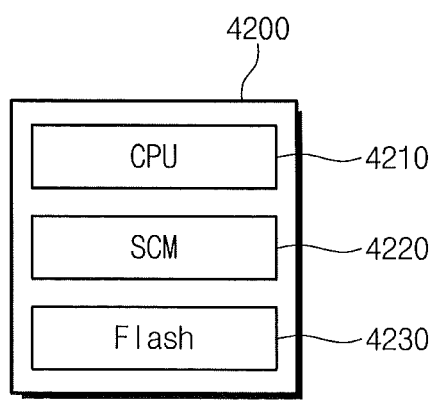
FIG. 21 is a block diagram illustrating another example of a memory system including a state-based nonvolatile memory device of the inventive subject matter.

FIG. 21 shows a memory system structure in which a nonvolatile memory (SCM) according to some embodiments of the inventive subject matter is used instead of a synchronous DRAM (SDRAM). A memory system 4200 includes a CPU 4210, a SCM 4220 and a flash memory 4230. Here, the SCM 4130 is used for main memory instead of SDRAM.

In the memory system 4200 illustrated in FIG. 21, the SCM 4220 may have low power consumption compared with a SDRAM. Energy consumed by a main memory in a computer system may reach 40% of the entire consumption of the computer system. Thus, an effort to reduce power consumption of a main memory is actively proceeding. The SCM 4220 may reduce dynamic energy consumption by an average 53% and energy consumption due to a power leakage by an average 73% compared with a conventional DRAM. Thus, the memory system 4200 including the SCM 4220 may reduce power consumption compared with a memory system that uses a SDRAM.

Figure 22:
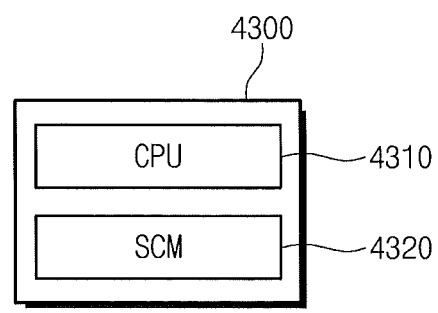
FIG. 22 is a block diagram illustrating still another example of a memory system including a state-based nonvolatile memory device of the inventive subject matter.

FIG. 22 shows a memory system structure in which a nonvolatile memory (SCM) according to some embodiments of the inventive subject matter is used instead of SDRAM and flash memory. A memory system 4300 includes a CPU 4310 and a SCM 4320. The SCM 4230 is used as a main memory instead of a SDRAM and is used as a data storage memory instead of a flash memory. The memory system 4300 may be advantageous from the standpoint of data accessing speed, low power consumption, space utilization and cost.

A nonvolatile memory device in accordance with some embodiments of the inventive subject matter may be mounted by various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

Some embodiments of the inventive subject matter provide state-based nonvolatile memory devices and error correction code operations in which a bit error rate with respect to each of bits constituting one codeword can be equalized. An error correction code for an error detection and correction can be easily designed and a bit error rate can be effectively controlled. Thus, some embodiments of the inventive subject matter may provide a state-based nonvolatile memory device having high reliability.

The above-disclosed subject matter is to be considered illustrative, and not restrictive, and the appended claims are intended to cover all such modifications, enhancements, and other embodiments, which fall within the true spirit and scope of the inventive subject matter. Thus, to the maximum extent allowed by law, the scope of the inventive subject matter is to be determined by the broadest permissible interpretation of the following claims and their equivalents, and shall not be restricted or limited by the foregoing detailed description.

What is claimed is:

1. A method of operating a memory device comprising a plurality of multi-bit memory cells, the method comprising:
encoding a plurality of input data bits according to an error correction code to generate a codeword comprising a plurality of groups of bits; and
programming respective ones of the plurality of multi-bit memory cells to represent respective ones of the groups of bits of the codeword.

2. The method of claim 1, wherein the groups of bits of the codeword comprise groups of consecutive bits.

3. The method of claim 1, wherein the multi-bit memory cells are each configured to store m bits and wherein a length of the codeword is an integer multiple of m.

4. The method of claim 1, wherein programming respective ones of the plurality of multi-bit memory cells to represent respective ones of the groups of bits of the codeword comprises state-based programming.

5. The method of claim 1, further comprising:
reading data from the plurality of multi-bit memory cells to recover the codeword; and
decoding the recovered codeword according to the error correction code to recover the input data bits.

6. The method of claim 5, wherein reading data from the plurality of multi-bit memory cells to recover the codeword comprises reading data from the plurality of multi-bit memory cells in page units to recover the codeword.

7. The method of claim 6, wherein reading data from the plurality of multi-bit memory cells in page units to recover the codeword comprises:
sequentially retrieving bits from each of the plurality of memory cells in order of bit significance; and
reordering the retrieved bits to recover the codeword.

8. The method of claim 5, wherein reading data from the plurality of multi-bit memory cells to recover the codeword comprises reading data from the plurality of multi-bit memory cells in cell units to recover the codeword.

9. The method of claim 8, wherein respective ones of the groups of bits of the codeword correspond to respective symbols and wherein the error correction code comprises a non-binary error correction code (ECC).

10. The method of claim 1, wherein multi-bit memory cells of the plurality of multi-bit memory cells are configured to be overwritten.

11. A memory device, comprising:
a plurality of multi-bit memory cells;
an error correction circuit configured to encode a plurality of input data bits according to an error correction code to generate a codeword comprising a plurality of groups of bits; and
a read/write circuit configured to program respective ones of the plurality of multi-bit memory cells to represent respective ones of the groups of bits of the codeword.

12. The memory device of claim 11, wherein the groups of bits of the codeword comprise groups of consecutive bits.

13. The memory device claim 11, wherein the multi-bit memory cells are each configured to store m bits and wherein a length of the codeword is an integer multiple of m.

14. The memory device of claim 11, wherein the read/write circuit is configured to support state-based programming of the plurality of memory cells.

15. The memory device of claim 11, wherein the read/write circuit is configured to read data from the plurality of multi-bit memory cells to recover the codeword and wherein the error correction circuit is configured to decode the recovered codeword according to the error correction code to recover the input data bits.

16. The memory device of claim 15, wherein the read/write circuit is configured to read data from the plurality of multi-bit memory cells in page units.

17. The memory device of claim 16, wherein the read/write circuit is configured to sequentially retrieve bits from each of the plurality of memory cells in order of bit significance and to reorder the retrieved bits to recover the codeword.

18. The memory device of claim 15, wherein the read/write circuit is configured to read data from the plurality of multi-bit memory cells in cell units to recover the codeword.

19. The memory device of claim 11, wherein respective ones of the groups of bits of the codeword correspond to respective symbols and wherein the error correction code comprises a non-binary error correction code (ECC).

20. The memory device of claim 11, wherein multi-bit memory cells of the plurality of multi-bit memory cells are configured to be overwritten.

* * * * *